United States Patent
Safavi Ardebili (10) Patent No.: US 8,651,360 B2
(45) Date of Patent: Feb. 18, 2014

(54) SYSTEMS AND METHODS FOR PROCESSING RIBBON AND WIRE IN ULTRASONIC BONDING SYSTEMS

(75) Inventor: Vahid Safavi Ardebili, Irvine, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 13/979,269

(22) PCT Filed: Jan. 12, 2012

(86) PCT No.: PCT/US2012/021057
§ 371 (c)(1),
(2), (4) Date: Jul. 11, 2013

(87) PCT Pub. No.: WO2012/099771
PCT Pub. Date: Jul. 26, 2012

(65) Prior Publication Data
US 2013/0292456 A1    Nov. 7, 2013

Related U.S. Application Data

(60) Provisional application No. 61/433,485, filed on Jan. 17, 2011.

(51) Int. Cl.
*B23K 1/06* (2006.01)
*B23K 31/02* (2006.01)
(52) U.S. Cl.
USPC ............ 228/110.1; 228/1.1; 228/4.5; 228/42; 228/180.5; 228/218; 228/219
(58) Field of Classification Search
None
See application file for complete search history.

(56) References Cited

U.S. PATENT DOCUMENTS

| | | | | |
|---|---|---|---|---|
| 3,970,239 | A * | 7/1976 | Hill | 228/220 |
| 4,387,283 | A * | 6/1983 | Peterson et al. | 219/56.21 |
| 4,646,958 | A * | 3/1987 | Howard, Jr. | 228/123.1 |
| 4,933,305 | A * | 6/1990 | Kikkawa | 438/120 |
| 5,046,658 | A * | 9/1991 | Morris | 228/206 |
| 5,205,461 | A * | 4/1993 | Bickford et al. | 228/220 |
| 5,722,581 | A * | 3/1998 | Sindzingre et al. | 228/206 |
| 5,948,476 | A | 9/1999 | Otake et al. | |
| 6,207,551 | B1 * | 3/2001 | Chungpaiboonpatana et al. | 438/617 |
| 8,342,385 | B2 * | 1/2013 | Dang et al. | 228/220 |
| 2005/0161488 | A1 | 7/2005 | Duan et al. | |

(Continued)

FOREIGN PATENT DOCUMENTS

| EP | 110635 A1 * | 6/1984 |
|---|---|---|
| EP | 1366826 A1 | 12/2003 |

(Continued)

OTHER PUBLICATIONS

International Search Report and written Opinion completed Mar. 30, 2012; International Patent Application No. PCT/US2012/021057.

*Primary Examiner* — Kiley Stoner
(74) *Attorney, Agent, or Firm* — Christopher M. Spletzer, Sr.

(57) ABSTRACT

An ultrasonic bonding system is provided. The system includes: a) a bond head assembly carrying an ultrasonic bonding tool; b) a conductive material supply; c) a conductive material feeding system for guiding a length of the conductive material supply to a position proximate the ultrasonic bonding tool; and d) a vapor generation system for supplying a vapor proximate the ultrasonic bonding tool, the vapor including a carrier gas and a lubricating vapor.

18 Claims, 7 Drawing Sheets

(56) References Cited

U.S. PATENT DOCUMENTS

2006/0219754 A1* 10/2006 Clauberg et al. ............... 228/4.5
2008/0036046 A1* 2/2008 Malolepszy et al. .......... 257/632
2012/0152398 A1* 6/2012 Laymon ....................... 138/155

FOREIGN PATENT DOCUMENTS

| GB | 1181280 A | 2/1970 |
|----|-----------|--------|
| JP | 10180179  | 7/1998 |
| SU | 749444 A  | 7/1980 |

* cited by examiner

SYSTEMS AND METHODS FOR PROCESSING RIBBON AND WIRE IN ULTRASONIC BONDING SYSTEMS

CROSS REFERENCE TO RELATED APPLICATION

This application claims the benefit of International PCT Application No. PCT/US2012/021057 filed Jan. 12, 2012, which claims the benefit of U.S. Provisional Application No. 61/433,485 filed on Jan. 17, 2011, the contents of both of which are incorporated herein by reference.

FIELD OF THE INVENTION

The present invention relates to ultrasonic bonding systems, and more particularly, to systems and methods for processing conductive materials in connection with such ultrasonic bonding systems.

BACKGROUND OF THE INVENTION

In the processing and packaging of devices (e.g., semiconductors, power packages, solar devices, etc.), ultrasonic bonding (e.g., wire bonding, ribbon bonding, etc.) continues to be a widely used method of providing electrical interconnection between two or more locations. For example, wire bonding machines are used to form wire interconnections between respective locations to be electrically interconnected. In certain exemplary ultrasonic bonding systems, an upper terminal end of a bonding tool is engaged in a transducer (e.g., an ultrasonic transducer). The transducer causes the bonding tool (e.g., a wedge bonding tool, a capillary bonding tool, a ribbon bonding tool, etc.) to vibrate resulting in bond formation between a portion of the wire and a bonding location (e.g., a bond pad, a lead of a leadframe, etc.).

The working surface (e.g., face) of the bonding tool used to bond the conductive material (e.g., the wire or ribbon material) to the bonding locations may deteriorate over time. For example, conductive material may adhere to the working surface of the bonding tool. Such adherence of the conductive material may be particularly problematic in bonding tools having a plurality of protrusions defined by the working surface (e.g., teeth defined by the working surface of a ribbon bonding tool). The deterioration of the working surface of the bonding tool results in a shortened useful life of the bonding tool, as well as inconsistent (or inferior) bonds formed using the bonding tool.

Thus, it would be desirable to provide improved ultrasonic bonding systems and methods of using the same.

SUMMARY OF THE INVENTION

According to an exemplary embodiment of the present invention, an ultrasonic bonding system is provided. The system includes: a) a bond head assembly carrying an ultrasonic bonding tool; b) a conductive material supply; c) a conductive material feeding system for guiding a length of the conductive material supply to a position proximate the ultrasonic bonding tool; and d) a vapor generation system for supplying a vapor proximate the ultrasonic bonding tool, the vapor including a carrier gas and a lubricating vapor.

According to another exemplary embodiment of the present invention, another ultrasonic bonding system is provided. The system includes: a) a bond head assembly carrying an ultrasonic bonding tool; b) a conductive material supply; c) a conductive material feeding structure for guiding a length of a conductive material from the conductive material supply to a position proximate the ultrasonic bonding tool; and d) a vapor generation system for supplying a vapor to the conductive material feeding structure, the vapor including a carrier gas and a lubricating vapor.

According to yet another exemplary embodiment of the present invention, a system for processing a conductive material is provided. The system includes: a conductive material supply; and a dispenser for dispensing a silane solution to a length of conductive material fed from the conductive material supply.

According to yet another exemplary embodiment of the present invention, another system for processing a conductive material is provided. The system includes: a conductive material supply; and a reservoir including a volume of a silane solution, wherein a length of conductive material from the conductive material supply is configured to be inserted into the volume of the silane solution.

According to yet another exemplary embodiment of the present invention, a method of processing a conductive material in connection with an ultrasonic bonding system is provided. The method includes the steps of: providing a length of the conductive material from a conductive material supply on the ultrasonic bonding system; and supplying a vapor from a vapor generation system to a portion of the conductive material on the ultrasonic bonding system, the vapor including a carrier gas and a lubricating vapor.

According to yet another exemplary embodiment of the present invention, another method of processing a conductive material is provided. The method includes the steps of: providing a length of the conductive material fed from a conductive material supply; and dispensing a silane solution to the length of the conductive material fed from the conductive material supply.

According to yet another exemplary embodiment of the present invention, another method of processing a conductive material is provided. The method includes the steps of: providing a length of the conductive material fed from a conductive material supply; and inserting the length of the conductive material into a volume of a silane solution.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

As used herein the term "lubricating vapor" is intended to refer to a broad class of materials that change the adhesion characteristics (e.g., reduce friction or adhesive characteristics) of the surface(s) to which they are applied or exposed. That is, in certain applications, a lubricating vapor may be considered as a material separating two surfaces (e.g., a film). However, a lubricating vapor may also be considered to change the surfaces themselves, thereby changing the adhesion characteristics of the surfaces. An example of a lubricating vapor is methanol vapor, which tends to change the adhesion characteristics of aluminum ribbon (or other conductive materials) to the bonding tool used to bond the aluminum ribbon.

According to various exemplary embodiments of the present invention, systems and processes are provided for reducing the build-up potential of a conductive material (e.g., an aluminum ribbon material) to the working surface of a ribbon bonding tool. For example, certain of the systems and processes have the goal of manipulating frictional processes between the bonding tool and the conductive material, where such frictional processes may lead to conductive material build-up on the bonding tool and dissipation of the conductive material from the bonding tool. The various techniques disclosed herein, may also be optimized by varying select bonding parameters based on the given application.

Figure 1:
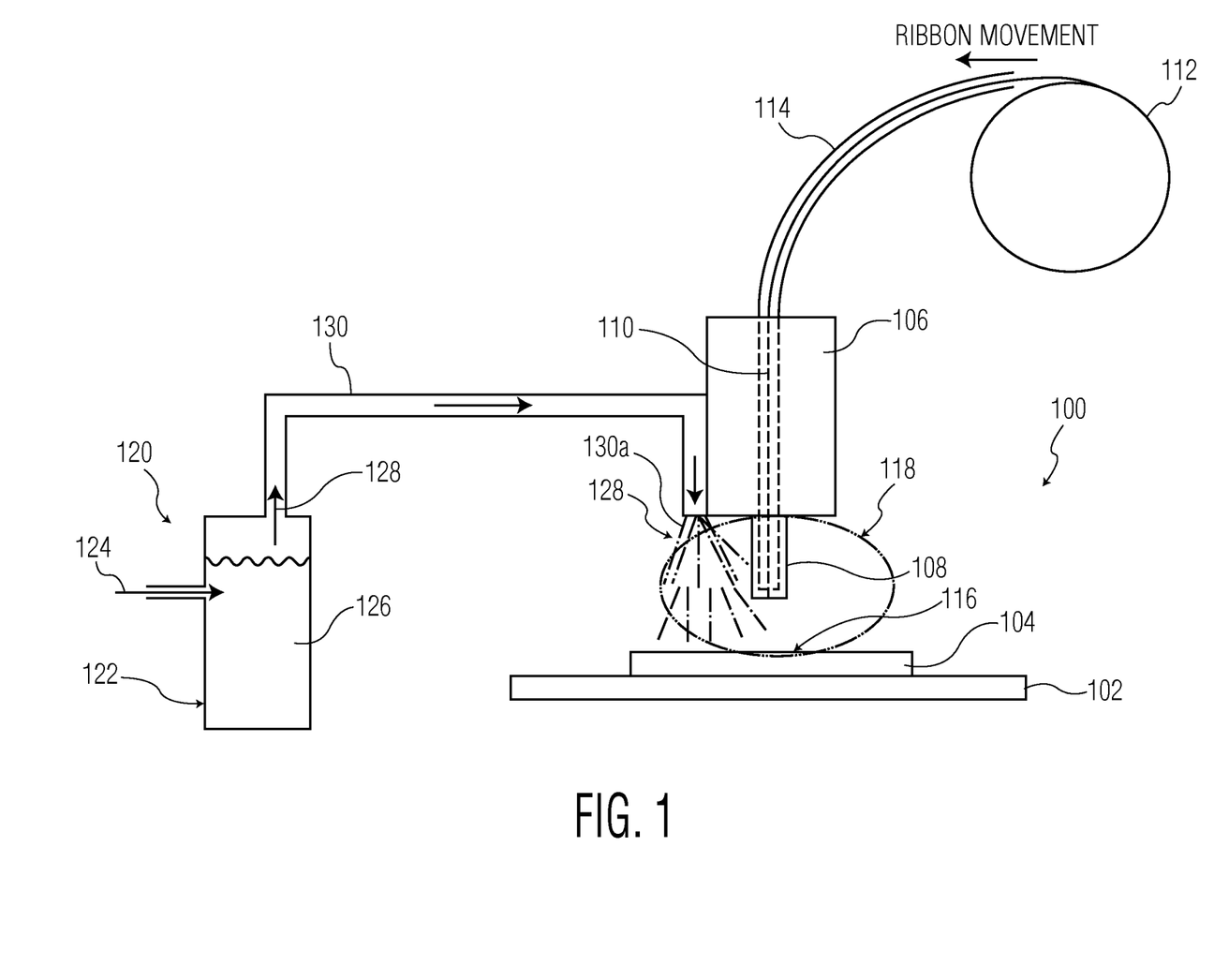
FIG. 1 is a side block diagram view of elements of an ultrasonic bonding system in accordance with an exemplary embodiment of the present invention.

FIG. 1 illustrates elements of ultrasonic bonding system 100 including bonding surface 102 (e.g., an anvil or other bonding surface of a ribbon bonding machine, a heat block or other bonding surface of a wire bonding machine, etc.). Workpiece 104 (e.g., a leadframe strip) is supported by bonding surface 102 during an ultrasonic bonding operation (e.g., a ribbon bonding operation, a wire bonding operation, etc.). Bond head assembly 106 of ultrasonic bonding system 100 supports an ultrasonic transducer (not shown) which in turn supports bonding tool 108 (e.g., a ribbon bonding tool, a wedge bonding tool, a ball bonding tool, etc.). Conductive material 110 (e.g., a conductive ribbon, a wire, etc.) is bonded to workpiece 104 using bonding tool 108. In the example shown in FIG. 1, conductive material 110 is a ribbon material provided on ribbon spool 112. Ribbon material 110 is fed from ribbon spool 112 to a position proximate bonding tool 108 on bond head assembly 106 using ribbon feeding tube 114 or the like. In the exemplary embodiment of the present invention illustrated in FIG. 1 it is desired to flood certain portions of ultrasonic bonding system 100 (e.g., bond site area 116 adjacent workpiece 104 below bonding tool 108 during the ultrasonic bonding, the area proximate working surface/tip of the bonding tool, etc.) with lubricating vapor 128 from vapor generation system 120. The exemplary vapor generation system 120 shown in FIG. 1 includes a "bubbler" type system wherein carrier gas 124 (e.g., compressed air, nitrogen, argon, forming gas including nitrogen and hydrogen, argon mixed with hydrogen, etc.) and lubricating vapor (e.g., methanol 126 vaporized via bubbler 122) combine to form flooding vapor 128. Flooding vapor 128 follows vapor delivery path 130 (e.g., tubing) from vapor generation system 120 to bond head assembly 106. Flooding vapor 128 exits path 130 at an outlet (e.g., a nozzle, a manifold, etc.) proximate bonding tool 108. In the example shown in FIG. 1, a portion of path 130 (e.g., tubing) including outlet 130a are carried by bond head assembly 106. Flooding vapor 128 creates vapor cloud 118 adjacent bonding tool 108 and bond site area 116 (e.g., a protective atmosphere 118) which assists in reducing the potential for build-up on the working face of the bonding tool 108.

Figure 2:
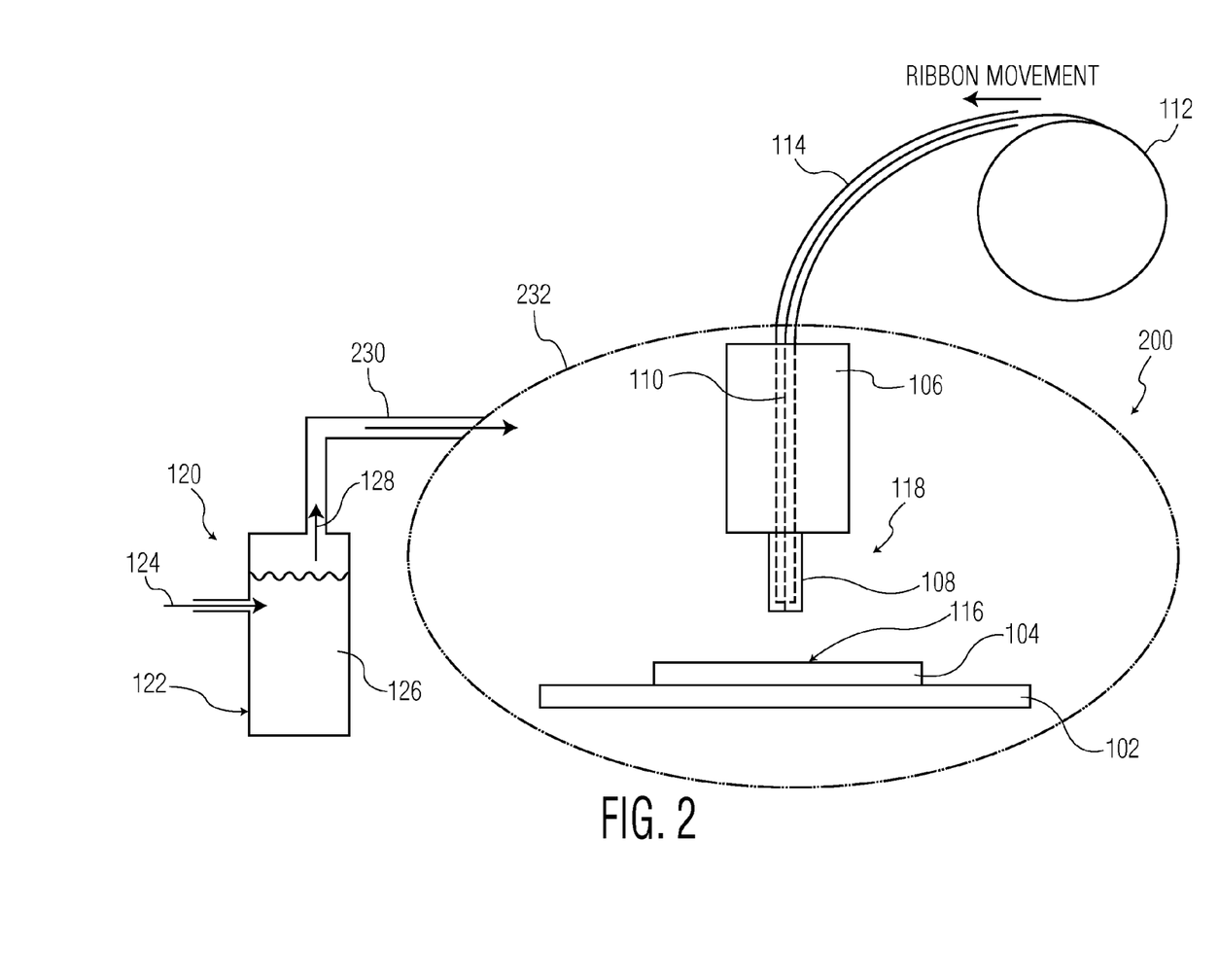
FIG. 2 is a side block diagram view of elements of another ultrasonic bonding system in accordance with another exemplary embodiment of the present invention.

FIG. 2 includes most of the same elements as shown in FIG. 1 (where like reference numerals refer to the same structure), and as such, a separate description is omitted herein. However, FIG. 2 also includes vapor delivery path 230 delivering the flooding vapor to vapor containment structure 232 surrounding certain elements of ultrasonic bonding system 200, where vapor containment structure 232 may be used to control the atmosphere therein. The elements enclosed by exemplary vapor containment structure 232 shown in FIG. 2 include bond head assembly 106 (including the transducer, not shown, and bonding tool 108), bonding surface 102 and workpiece 104. Vapor containment structure 232 may be a flexible structure (such as a bladder or bag), a substantially rigid structure, or a combination thereof. It is also noted that containment structure 232 may contain less, or more, elements from that shown.

Although FIGS. 1-2 illustrate bubbler 122 used in connection with vapor generation system 120, where bubbler 122 vaporizes liquid 126 (e.g., methanol 126) which combines with carrier gas 124, other vapor generation systems are contemplated. For example, methanol (or other lubricant vapor) could be sprayed (e.g., through a nozzle), injected, or otherwise be combined with the carrier gas.

Figure 3A:
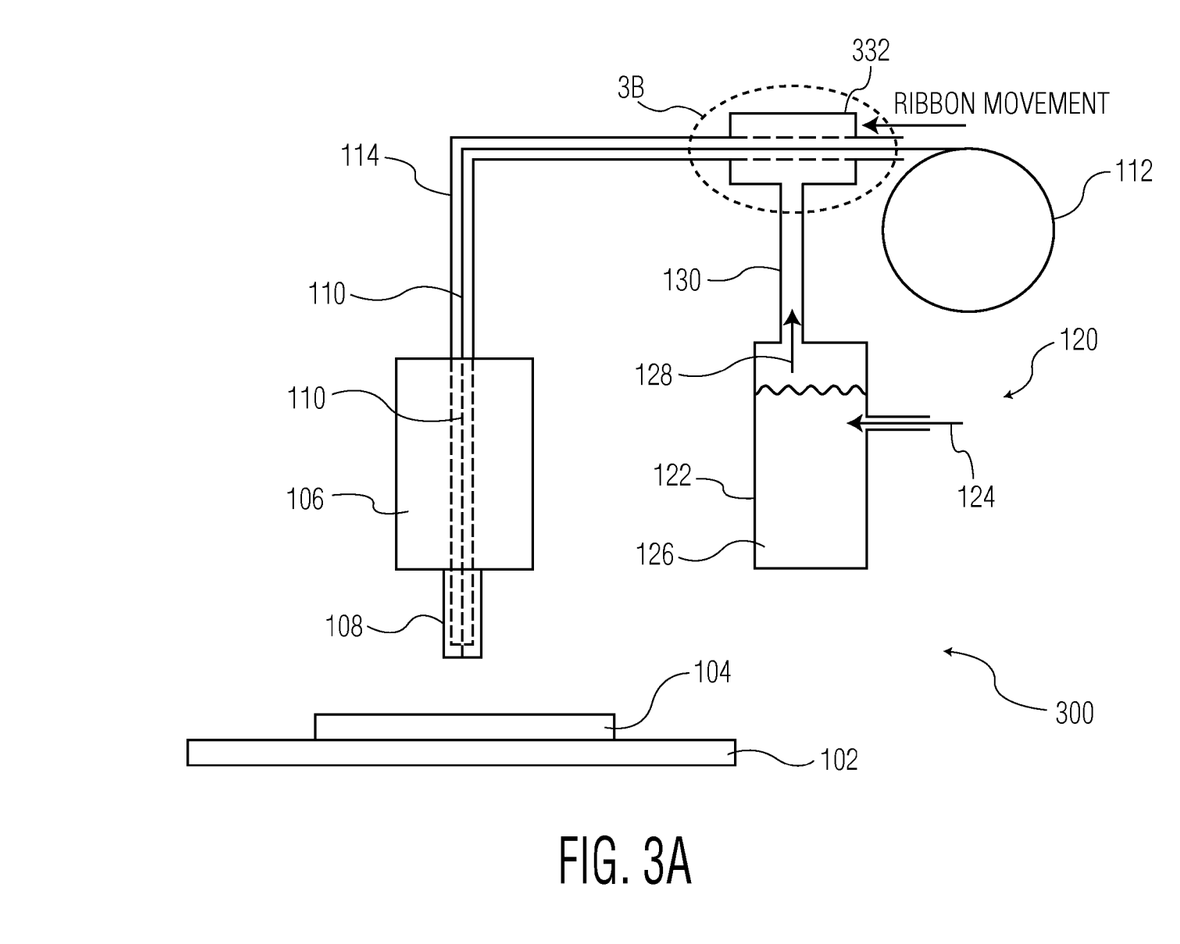
FIG. 3A is a side block diagram view of elements of another ultrasonic bonding system in accordance with another exemplary embodiment of the present invention.
Figure 3B:
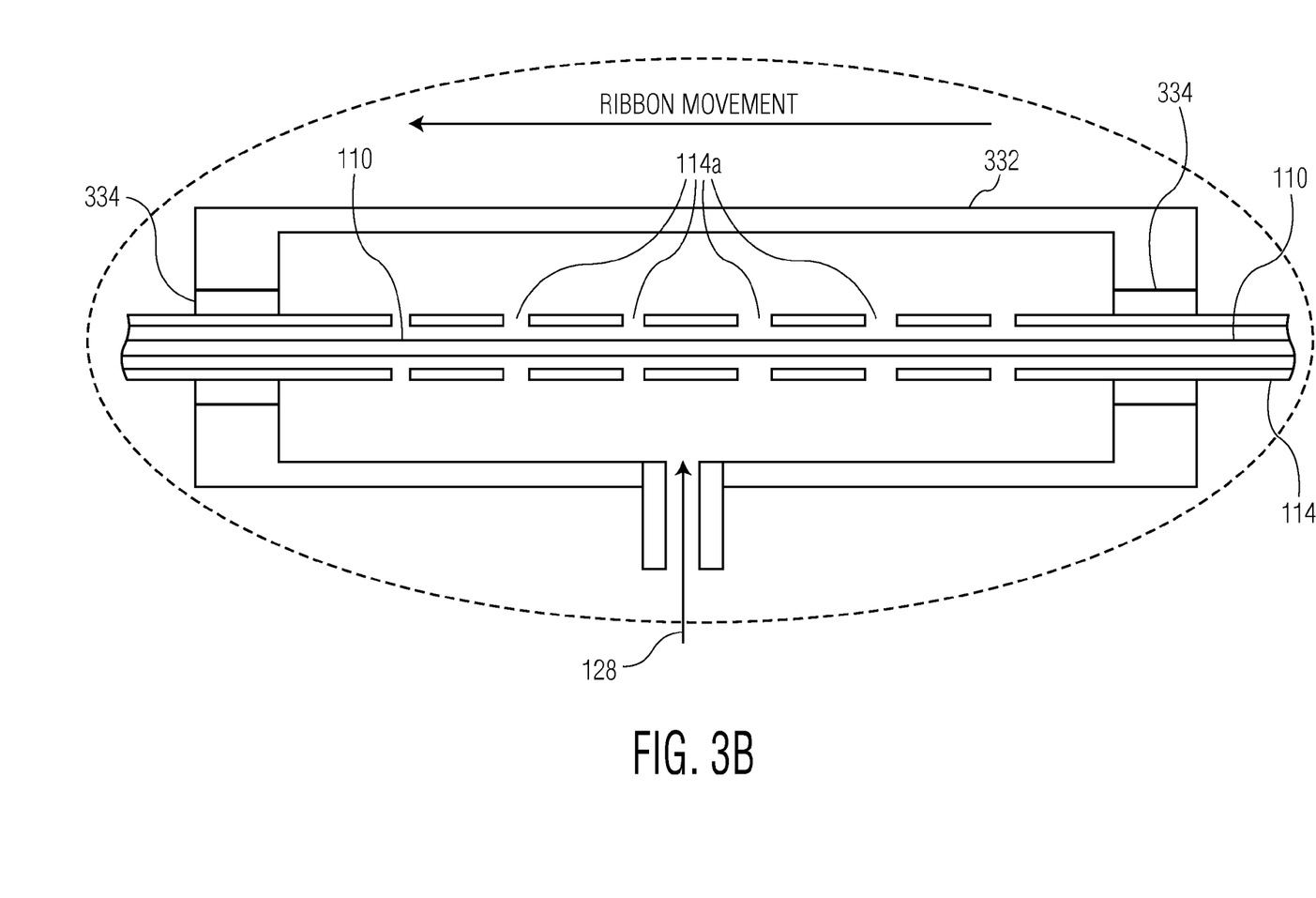
FIG. 3B is a detailed view of a portion of FIG. 3A.

Ultrasonic bonding system 300 shown in FIGS. 3A-3B includes various elements similar to those shown in FIG. 1 (where like reference numerals refer to the same or similar structures, but in a different configuration as illustrated), and as such, a separate description is omitted herein. However, system 300 shown in FIG. 3A includes vapor generation system 120 that directs lubricating vapor 128 (e.g., vaporized methanol combined with carrier gas 124) to a portion of conductive material feeding structure 114 (e.g., a ribbon feeding tube 114, etc.). FIG. 3B (an enlarged view of dashed circle "3B" in FIG. 3A) illustrates a detailed view of how lubricating vapor 128 may enter ribbon feeding tube 114. In this specific example, vapor 128 enters vapor receiving structure 332 (e.g., a spool piece 332) surrounding a portion of ribbon feeding tube 114. This portion of ribbon feeding tube 114 defines perforations 114a, or other apertures, through which vapor 128 enters ribbon feeding tube 114. Seals 334 restrict lubricating vapor 128 in the vicinity of perforations 114a (e.g., substantially within structure 332). Lubricating vapor 128 then adsorbs onto the surface of ribbon material 110 in ribbon feeding tube 114.

As will be appreciated by those skilled in the art, it may be desirable to expose the ribbon material to the vapor within the ribbon feed tube for a predetermined time period prior to bonding the processed ribbon material. That is, the adsorption of the molecules into the ribbon material surface may preferably involve such a time period (e.g., a period of greater than 10 seconds, a period between 10 seconds and 5 minutes, a period between 1-10 minutes, amongst other time periods). Of course, the time period may largely depend upon the exact application (e.g., the composition of the vapor, other characteristics of the vapor, the composition of the ribbon or other conductive material, etc.).

Figure 4A:
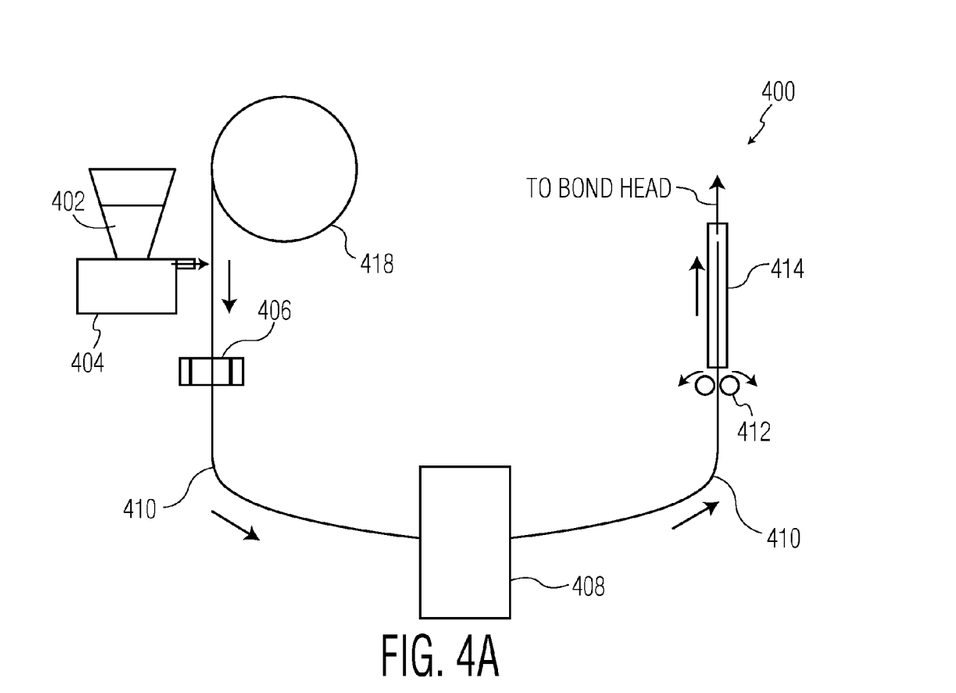
FIGS. 4A-4D are block diagram views of elements of various ultrasonic bonding systems in accordance with various exemplary embodiments of the present invention.
Figure 4B:
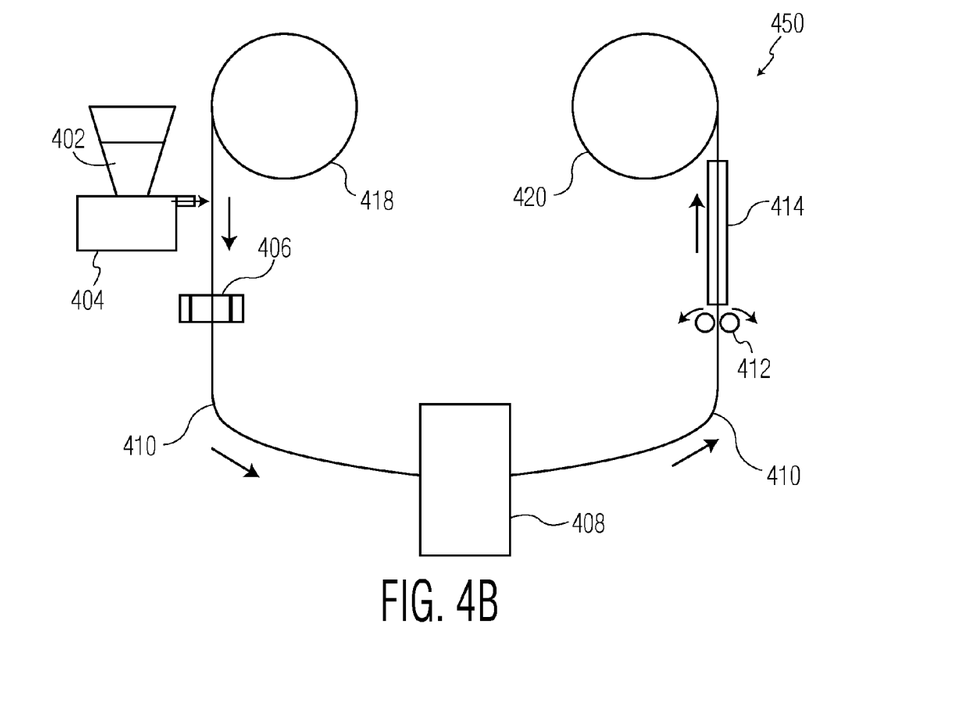

FIGS. 4A-4B illustrate exemplary systems for processing a conductive material (a ribbon material is illustrated, but other conductive materials, such as wire, are also contemplated). The systems may be integrated into an ultrasonic bonding system 400 (e.g., as shown in FIG. 4A), or may be integrated into a system 450 for manufacturing or re-spooling of the ribbon material (e.g., as shown in FIG. 4B).

Referring specifically to FIG. 4A, conductive material supply 418 (e.g., ribbon spool 418) supplies ribbon material 410. Ribbon 410 passes dispenser 404 which dispenses silane solution 402 to a surface of a length of ribbon material 410 fed from ribbon supply 418. Silane solution 402 may coat only one side of ribbon material 410 (e.g., the side configured to contact the ribbon bonding tool, not shown), both sides of ribbon material 410, or the entire exterior surface of ribbon material 410 to form a silane compound coating. For example, silane solution 402 may be dispensed using an ink jet head, a spray nozzle, a wick, amongst others. After silane solution 402 is dispensed on ribbon material 410, ribbon material 410 passes through curing mechanism 406 (e.g., heater 406) for curing silane solution 402 to form a silane compound coating ribbon material 410. That is, after silane solution 402 contacts a surface of ribbon material 410, the molecules of the silane may become bonded (e.g., chemically bonded) to the conductive ribbon, and to one another in molecular chains, thereby forming a silane compound on ribbon material 410. After curing, ribbon material 410 passes through other elements (e.g., feed sensor 408, feed rollers 412, etc.) on its way to ribbon feed tube 414, and then to the bond head assembly (not shown, but similar to the bond head assembly 106 described above) of ultrasonic bonding system 400. Through the application of silane solution 402 (e.g., and its absorption or adhesion to the surface of ribbon material 410 to form silane compound), there is a reduced potential for build-up of conductive material on the working face of the bonding tool in a variety of applications. System 450 of FIG. 4B differs from FIG. 4A in that following curing, ribbon material 410 passes through other elements (e.g., feed sensor 408, feed rollers 412, etc.) on its way to storage spool 420 (e.g., where the storage spool may later be used in connection with an ultrasonic bonding operation). Otherwise, the elements of FIG. 4B having the same reference numerals of elements of FIG. 4A are the same, or similar, elements.

Figure 4C:
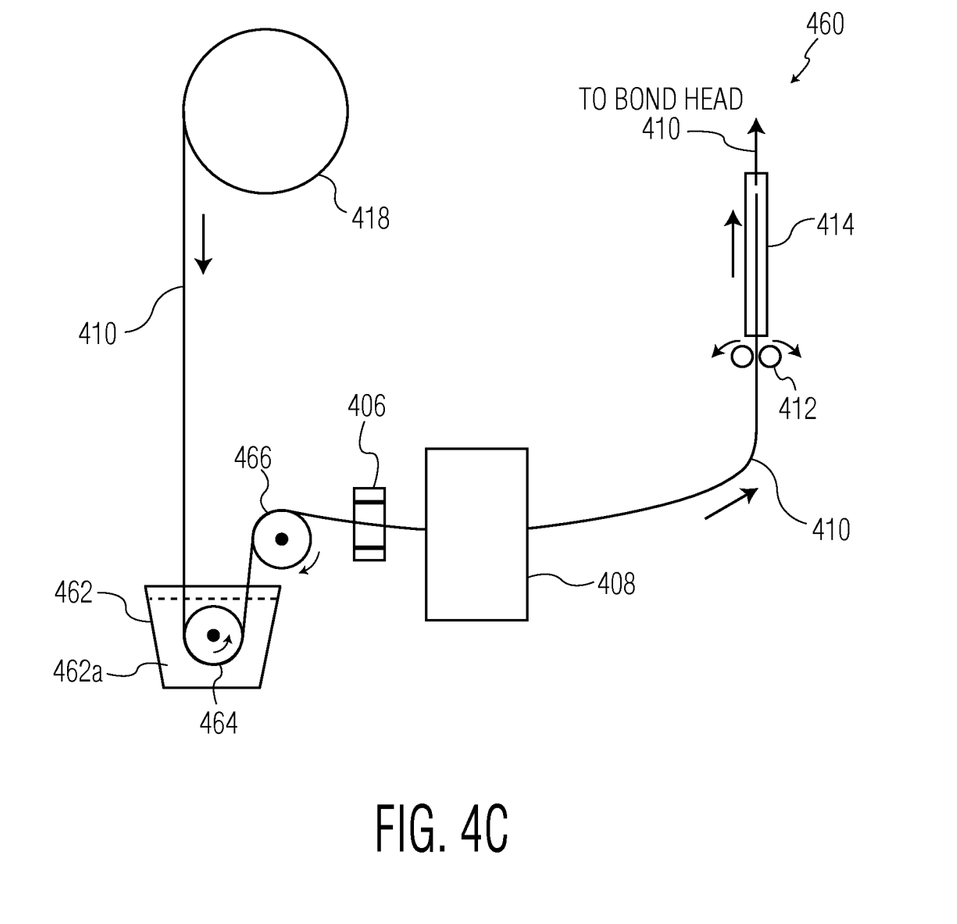
Figure 4D:
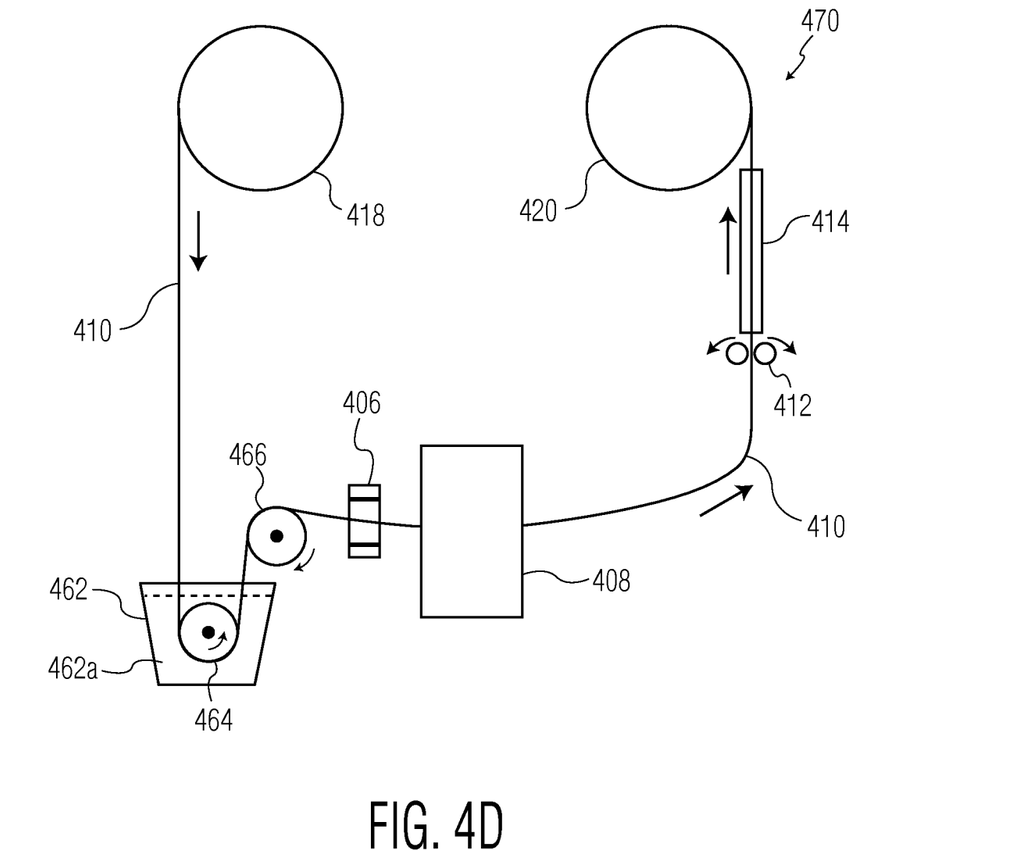

The silane solution described in connection with FIGS. 4A-4B may be applied in liquid or vapor form. In an example liquid form, the silane may be dissolved in a liquid (e.g., water) prior to being applied to ribbon material 410 by dispenser 404. While FIGS. 4A-4B relate to systems including dispenser 404 for dispensing silane solution 402 onto ribbon 410, the present invention also contemplates alternative methods of providing a connection between silane solution 402 and ribbon material 410. For example, FIG. 4C illustrates ultrasonic bonding system 460 including reservoir 462 (including silane solution 462a) and guides 464, 466 (such as rollers, capstans, etc.). Otherwise, the elements of FIG. 4C (having the same reference numerals as elements of FIG. 4A) are the same or substantially similar elements. In FIG. 4C, as ribbon 410 is fed in the path shown in FIG. 4A, ribbon 410 passes through (e.g., is dipped or is otherwise inserted into) silane solution 462a in reservoir 462. For example, guides 464, 466 (e.g., rollers, capstans, etc.) may be used to pass ribbon 410 through silane solution 462a. FIG. 4D includes system 470 which is similar to system 450 of FIG. 4B (with like elements having identical reference numerals) except that system 470 includes silane solution 462a in reservoir 462 (and guides 464, 466), similar to system 460 of FIG. 4C. Thus, system 470 is configured to re-spool ribbon material 410 to storage spool 420 after application of silane solution 462a.

While FIGS. 4A-4D have been described primarily in connection with silane solutions it is not limited thereto. As will be appreciated by those skilled in the art, silane solution molecules tend to be molecular chains that include organic and inorganic portions (e.g., one end of the chain being organic, the other end of the chain being inorganic), and, once adsorbed on, for example, a conductive ribbon or wire, become silane compounds. Other materials, having similar properties, may be used depending upon the specific application (e.g., depending upon their ability to adhere or adsorb, or not adhere or adsorb, to the specific conductive material). Further still, in certain applications it may be desirable to apply liquid methanol or a similar solution/compound (as opposed to silane) in the systems of FIGS. 4A-4D.

It should be understood that the elements included in the various exemplary embodiments of the present invention described herein are illustrative only. For example, additional or different elements may be included. Further, the orientation and positioning of the various elements may be altered from that shown in the drawings, as desired in the given application. As a non-limiting example, feed sensor 408 and/or feed rollers 412 (shown in FIGS. 4A-4D) may be positioned in different locations as desired (e.g., upstream of, and prior to application of the silane solution at dispenser 404 or reservoir 462).

While the various exemplary embodiments of the present invention have been described in connection with ultrasonic ribbon bonding it is not limited thereto. For example, the teachings of the present invention (including those examples shown in the drawings) may be applied to other materials such as wire for wire bonding.

Through the various techniques disclosed herein, systems and methods for affecting the surface interaction of a conductive material are provided. For example, the systems and methods may affect frictional interactions between the bonding tool and the conductive material in order to reduce the potential for build-up of the conductive material on the bonding tool. The reduced potential for build-up leads to longer useful bonding tool life (e.g., less time between changing the bonding tool), improved bond reliability, and more consistent bonds formed using the bonding tool.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ultrasonic bonding system comprising:
   a) a bond head assembly carrying an ultrasonic bonding tool;
   b) a conductive material supply;
   c) a conductive material feeding system for guiding a length of the conductive material supply to a position proximate the ultrasonic bonding tool; and
   d) a vapor generation system for supplying a vapor proximate the ultrasonic bonding tool, the vapor including a carrier gas and a lubricating vapor, wherein the lubricating vapor comprises methanol.

2. The ultrasonic bonding system of claim 1 wherein the conductive material supply comprises a conductive ribbon spool.

3. The ultrasonic bonding system of claim 1 wherein the carrier gas includes at least one of compressed air, nitrogen, and argon.

4. The ultrasonic bonding system of claim 1 wherein the vapor generation system includes a bubbler feeding the vapor to an outlet proximate the ultrasonic bonding tool.

5. The ultrasonic bonding system of claim 4 wherein the outlet is carried by the bond head assembly.

6. The ultrasonic bonding system of claim 1 wherein the vapor generation system supplies the vapor within a vapor containment structure, the vapor containment structure substantially enclosing the bond head assembly.

7. The ultrasonic bonding system of claim 1 wherein the conductive material supply includes at least one of a conductive ribbon supply and a wire supply.

8. An ultrasonic bonding system comprising:
a) a bond head assembly carrying an ultrasonic bonding tool;
b) a conductive material supply;
c) a conductive material feeding structure for guiding a length of a conductive material from the conductive material supply to a position proximate the ultrasonic bonding tool; and
d) a vapor generation system for supplying a vapor to the conductive material feeding structure, the vapor including a carrier gas and a lubricating vapor.

9. The ultrasonic bonding system of claim 8 wherein the lubricating vapor comprises methanol.

10. The ultrasonic bonding system of claim 8 wherein the carrier gas includes at least one of compressed air, nitrogen, and argon.

11. The ultrasonic bonding system of claim 8 wherein the vapor generation system includes a bubbler.

12. The ultrasonic bonding system of claim 8 wherein the conductive material supply includes at least one of a conductive ribbon supply and a wire supply.

13. A system for processing a conductive material, the system comprising:
a conductive material supply;
a dispenser for dispensing a silane compound to a length of conductive material fed from the conductive material supply; and a curing mechanism for curing the silane compound on the length of the conductive material, wherein the dispenser includes at least one of: (a) a vapor dispenser for dispensing the silane compound as a vapor; and (b) a liquid dispenser for dispensing the silane compound as a liquid.

14. The system of claim 13 wherein the system is integrated into at least one of an ultrasonic ribbon bonding machine and an ultrasonic wire bonding machine.

15. The system of claim 13 further comprising a conductive material storage structure for storing the length of the conductive material after dispensing of the silane compound to the length of the conductive material.

16. A method of processing a conductive material in connection with an ultrasonic bonding system, the method comprising the steps of:
a) providing a length of the conductive material from a conductive material supply on the ultrasonic bonding system, and guiding the length of the conductive material through a conductive material feeding structure positioned between (1) the conductive material supply and (2) a position proximate an ultrasonic bonding tool of the ultrasonic bonding system; and
b) supplying a vapor from a vapor generation system to a portion of the conductive material in the conductive material feeding structure on the ultrasonic bonding system, the vapor including a carrier gas and a lubricating vapor.

17. The method of claim 16 wherein the lubricating vapor comprises methanol.

18. The method of claim 16 wherein the vapor generator system comprises a bubbler.

* * * * *